(12) United States Patent
Lee

(10) Patent No.: US 9,134,342 B2
(45) Date of Patent: Sep. 15, 2015

(54) INTERGRATED APPARATUS AND METHOD FOR TESTING OF SEMICONDUCTOR COMPONENTS USING A TURRET MACHINE

(71) Applicant: EXIS TECH SDN BHD, Seremban (MY)

(72) Inventor: Heng Lee Lee, Seremban (MY)

(73) Assignee: EXIS TECH SDN BHD, Seremban (MY)

( * ) Notice: Subject to any disclaimer, the term of this patent is extended or adjusted under 35 U.S.C. 154(b) by 95 days.

(21) Appl. No.: 13/901,658

(22) Filed: May 24, 2013

(65) Prior Publication Data
US 2013/0314113 A1  Nov. 28, 2013

(30) Foreign Application Priority Data
May 24, 2012  (MY) ............................ PI 2012002321

(51) Int. Cl.
*G01R 31/26* (2014.01)
*G01R 1/04* (2006.01)
*G01R 31/01* (2006.01)
*G01R 31/28* (2006.01)

(52) U.S. Cl.
CPC .............. *G01R 1/0408* (2013.01); *G01R 31/01* (2013.01); *G01R 31/26* (2013.01); *G01R 31/2893* (2013.01)

(58) Field of Classification Search
USPC ............... 324/750.16, 740, 739, 834, 757.01, 324/750.3, 756.02, 750.15, 762.01, 555, 75, 324/0.01, 750.13, 756.01, 757.03, 757.04, 324/759.03, 762.06; 209/571, 573, 572; 29/740, 739, 834
See application file for complete search history.

(56) References Cited

U.S. PATENT DOCUMENTS

| 8,280,543 B2 * | 10/2012 | Grau et al. ..................... 700/112 |
| 2004/0193302 A1 * | 9/2004 | Kou ............................... 700/114 |
| 2007/0014652 A1 * | 1/2007 | Kanno et al. ............. 414/222.13 |
| 2007/0018673 A1 * | 1/2007 | Hsieh ............................ 324/765 |
| 2010/0097075 A1 * | 4/2010 | Sze et al. ...................... 324/555 |
| 2010/0232915 A1 * | 9/2010 | Jin et al. ................... 414/225.01 |
| 2011/0309842 A1 * | 12/2011 | Behzad et al. ................. 324/501 |

* cited by examiner

*Primary Examiner* — Melissa Koval
*Assistant Examiner* — Nasima Monsur
(74) *Attorney, Agent, or Firm* — Bacon & Thomas, PLLC

(57) ABSTRACT

The invention discloses a semiconductor components delivery system associated with a turret type testing apparatus for testing integrity and functionality of semiconductor components wherein at least two input feeders loadable with semiconductor components to be vision checked, tested and/or packed are provided. The delivery system is also provided with multiple output means such as a tube, a tape or a bin or a combination thereof for semiconductor components determined to be non defective.

13 Claims, 2 Drawing Sheets

INTERGRATED APPARATUS AND METHOD FOR TESTING OF SEMICONDUCTOR COMPONENTS USING A TURRET MACHINE

FIELD OF INVENTION

The present invention relates to a semiconductor component delivery system associated with a turret type testing apparatus for testing integrity and functionality of the semiconductor components. Such tests include identifying physical defects and determining the electrical integrity of the internal circuit of the semiconductor components.

BACKGROUND OF THE INVENTION

U.S. Pat. No. 7,643,961 B2 relates to a position detecting device and a position detecting method, and, particularly, to a position detecting device and a position detecting method effective with regard to wafer alignment in semiconductor exposure devices and its objective is to archive a high-precision position detecting method and position detecting device to serve as an alignment or overlaying detection device in an exposure apparatuses used in manufacturing semiconductor devices, wherein position detection precision is not lost even in the event that the alignment marks to be used are not symmetric, or further in the event that there are irregularities in the non-symmetry of multiple alignment marks within the same wafer.

European Patent Application No. EP 0 397 937 A2 disclosed an automatic test equipment, and more particularly to automated parametric test systems for determining the characteristics of integrated circuits during the development of processes for manufacturing such circuits. The invention further disclosed, in the development of processes for manufacturing integrated circuits, it is necessary to frequently conduct tests on semiconductor components manufactured by the process, to determine whether structures on the individual semiconductor components meet desired specifications. Accordingly, once a process is developed, a sample of components is manufactured in accordance with the process and parametric tests are performed on the components to determine the effects the process may have on operating characteristics of circuit devices within the said components.

U.S. Pat. No. 7,884,936 B2 relates generally to semiconductor metrology and inspection. More specifically, it relates to metrology or inspection that employs scanning of a target with an incident beam. Due to the large scale of circuit integration and the decreasing size of semiconductor devices, the device must comply with rigorous specification requirements prior to shipment of the device to the end users or customers. Particular parameters are measured or characterized within special test structures or targets using metrology or inspection tool. By way of example, multiple targets are designed to measure misalignment or overlay errors between two adjacent layers. In an inspection or metrology process, an incident beam is directed towards a particular spot, which includes a first target. After the incident beam reacts with the first target, the output beam is then collected from the first target. The incident beam is required to remain at the first target until enough information is collected into the output beam scattered from the first target. The collected output beam can then be analyzed to determine various characteristics regarding the first target.

Presently, turret type testing apparatus that is capable of rotating in a circular motion where the semiconductor components are sent to the tester one at a time are known. This type of tester machines can only test one type of semiconductor components at one time.

In view of this and other shortcomings of the existing art, it would be useful and advantageous if the delivery system of the turret type testing apparatus could be improved to allow more than one semiconductor components to be tested simultaneously on the same testing apparatus. In this way, if the semiconductor components to be tested are of the same types, the throughout would be doubled. Alternatively, the delivery system also enables at least two different types of semiconductor components to be tested simultaneously on the same testing apparatus. By testing at least two different types of semiconductor components simultaneously, the number of testing apparatus required on site could be reduced, with significant improved productivity and efficiency. Besides, it could save cost, time and space by conducting tests on at least two semiconductor components in parallel.

It is also an objective of the present invention to provide for a delivery system where the tested non defective semiconductor components can be packaged in more than one way in the same testing apparatus, including a tube, a tape or a bin or a combination thereof.

SUMMARY OF THE INVENTION

Semiconductor components are usually subject to visual inspection and parametric tests after the assembly process is completed. The tests include identifying marking or physical defects and determining the electrical integrity of the internal circuit of the semiconductor components. The tests that are carried out are based on customer requirements and thus the number of tests varies for different customers.

In each set of tests, there is a plurality of spaced apart, sequentially arranged module positions for each input feeder, with selected module positions provided with functional modules, the modules are seated on a locator mounted on a base plate of the testing apparatus. As a start, semiconductor components are loaded into an input feeder. The input feeder will feed the semiconductor component one at a time sequentially to a receiving module.

The semiconductor component will then be picked up from the receiving module by a pick-up head coupled to a periphery of a rotatable turret of the testing apparatus and placed on the next functional module. Here, the semiconductor component undergoes a visual inspection for any physical defects or orientation. For The semiconductor components with markings, a rotary table is provided to move the component out from the module position and placed under a camera before returning back to the same module position it was moved out from. In this case, the component is also checked for marking defect.

The checked semiconductor component is then picked up again and placed at the next module, which is the rotary or gimbal module. Based on the result of visual inspection from the previous module, any semiconductor components with wrong orientation will be corrected. This is to ensure the following tests are carried out in a correct manner where electrical integrity of the internal circuit of the semiconductor component will be tested. A tester will be mounted on the next module, the pick up head will then press the semiconductor component onto the tester, for example a printed circuit board.

After completing all the parametric tests, the semiconductor components that passed all the tests are collected at an output module. On the other hand, the semiconductor components that failed at least one of the previous tests are sent to another output module which collects the rejected components.

BRIEF DESCRIPTION OF THE DRAWINGS

To further clarify various aspects of some embodiments of the present invention, a more particular description of the invention will be rendered by references to specific embodiments thereof, which are illustrated, in the appended drawings. It is appreciated that these drawings depict only typical embodiments of the invention and are therefore not to be considered limiting of its scope. The invention will be described and explained with additional specificity and detail through the accompanying drawing in which.

DETAILED DESCRIPTION OF THE INVENTION

A detailed description of the preferred embodiment of the invention is disclosed herein. It should be understood, however, that the disclosed preferred embodiments are merely exemplary of the invention, which may be embodied in various forms. Therefore, the details disclosed herein are not to be interpreted as limiting, but merely as the basis for the claims and for teaching one skilled in the art on the invention.

Figure 1:
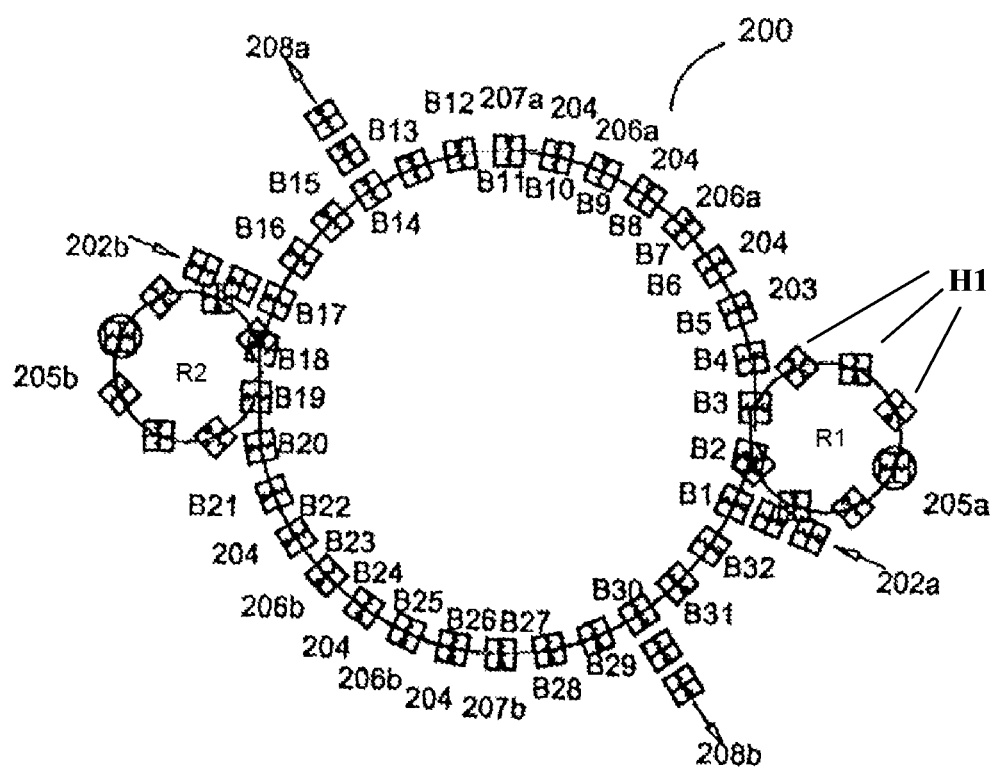
FIG. 1 is the top plan schematic view of the module positions of the delivery system associated with a turret type testing apparatus for testing integrity and functionality of semiconductor components according to the preferred embodiment of the present invention.

Referring to FIG. 1, a turret type testing apparatus for testing integrity and functionality of semiconductor components typically has a plurality of spaced apart, sequentially arranged module positions (B1 to B32). At some of these module positions (B1 to B32) are provided with functional modules performing different functions. These modules could include a receiving module (located at module position B1), a gimbal module (located at module position B4), at least one testing modules (located at any of module positions B5 to B13), at least one output modules for semiconductor components tested to be non defective (located at any of module positions B6 to B13 after the test module or test modules) and at least one output module for semiconductor components visually checked or tested to be defective (located generally at module positions B15 or B16).

Figure 2:
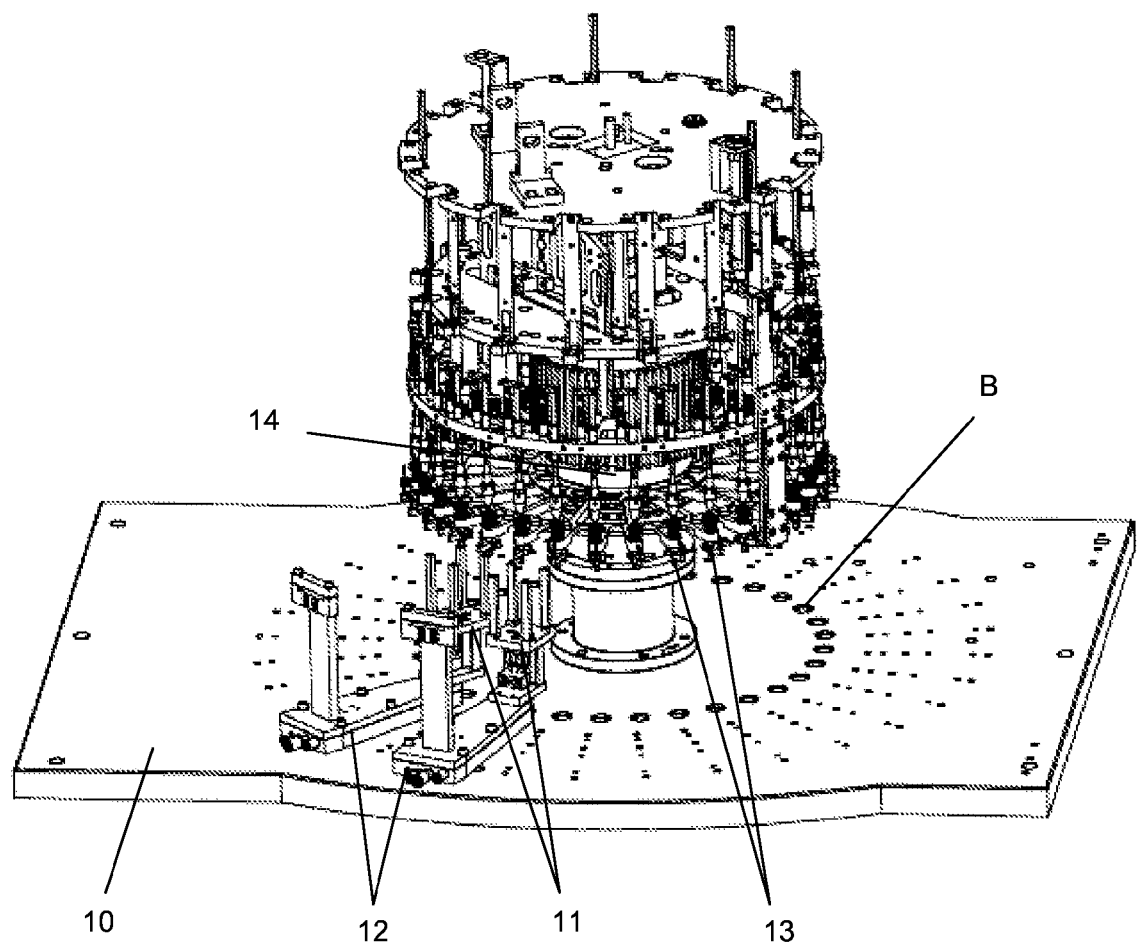
FIG. 2 is a perspective view of a turret type testing apparatus for the purpose of showing the base plate of the testing apparatus, the pick-up heads, the module positions and the locators.

Referring to FIG. 2, a turret type of testing apparatus would typically have a plurality of pick-up heads (13) coupled to a periphery of a rotatable turret (14) of the testing apparatus, with a pick-up head (13) aligned vertically above each module positions (B1 to B32), and with each pick-up head (13) advancing to the next module position concurrently with all other pick-up heads (13) as the turret (14) advances one module position (B1 to B32) at a time and with each pick-up head moveable vertically up and down to place, press on and/or pick up a semiconductor component from the respective module. For simplicity of illustration, FIG. 2 shows only two functional modules (11), in this case both are test modules. Each of these modules (11) is seated on a locator (12) which in turn is mounted on a base plate (10) of the testing apparatus.

Referring again to FIG. 1, the receiving module (located at module position B1) receives semiconductor components fed sequentially from the input feeder (202a). The rotary or gimbal module (located at module position B4) adjusts the orientation of the semiconductor component placed on it based on signal received from a visual inspection system. The test modules perform integrity and/or functionality test and/or parametric test on the semiconductor component placed by the pick-up head on these modules. The number of test modules provided depends on the number of tests required to be performed. The output module for non-defective semiconductor components could be a tube, a tape or a bin adapted to receive the semiconductor components or could be a combination of these output means. The output module for rejected components is typically a bin but is not so necessary limited to so.

In FIG. 1, two input feeders (202a, 202b) loadable with semiconductor components to be vision checked, tested and/or packed are shown. The input feeder (202a or 202b) could a bowl feeder, a tube loader, a tray loader or a detaper module. In this case, the delivery system would include for each input feeder (202a or 202b) the modules mentioned above, namely a receiving module (located at module position B1), a gimbal module (located at module position B4), at least one testing module, at least one output module for semiconductor components tested to be non defective and at least one output module for semiconductor components tested to be defective.

With two input feeders (202a, 202b) provided, two types of semiconductor components can be tested simultaneously by loading one different type of semiconductor into each of the input feeders (202a or 202b). This is possible because each input feeder (202a or 202b) is provided with a set of spaced apart, sequentially arranged module positions (B1 to B16 and B17 to B32) and the turret type testing apparatus are capable to be programmed respectively to test the two different semiconductor components. However, if the semiconductor components loaded into the input feeders (202a, 202b) are the same, the throughput of the testing process will be doubled.

The delivery system is initiated by loading the semiconductor components into the input feeders (202a, 202b). The semiconductor components are then fed to the receiving module (located at module position B1) one at a time, while the orientation of the semiconductor component is random. The test sequence begins with a pick-up head picking up a semiconductor component fed into the receiving module (located at module position B1) from the input feeder (202a).

For unmarked semiconductor components, the semiconductor component is then placed on an inspection module (located at module position B2 or B3) to check on the orientation using visual inspection equipment that check on the bottom of the semiconductor component for leads pattern to determine the orientation of the component. The component is then picked up by the same pick-up head and transferred to a gimbal module (located at module position B4). At the same time, the gimbal module receives a signal, based on the visual inspection done, to orientate the semiconductor component to the correct orientation if the orientation of the semiconductor component is checked otherwise.

If the component is marked, a rotary table (R1) mounted with a plurality of semiconductor component holding modules (H1) arranged in a circle and with the component holding modules level with the module positions (B1 to B32) is further provided. When a component holding module is rotated into module position B3, located between the receiving module at B1 and the gimbal module at B4, a semiconductor component is placed thereon by one of the pick-up head. The rotary table rotates this component holding module under a camera (205a) for visual inspection for any marking defects on the semiconductor component and at the same time check on the polarity or orientation of the component. After visual inspection this component holding module rotates back into the same module position at B3, enabling the semiconductor component to be picked up by a pick-up head for subsequent operation. Again, a signal is provided to the gimbal module to orientate the semiconductor component to the correct orientation if the orientation of the semiconductor component is checked otherwise. After orientation at the gimbal station, the component will be picked up by the same pick-up head for subsequent operations such as parametric tests. If the marking is defective, no further tests will be conducted and the component will be placed on the output module for rejected components when the pick-up head holding the component reaches the output module for defective components. The parameters of the parametric test are programmable depends on the user's requirements and the number of test modules required also can be adapted to user requirements. In a preferred embodiment, at the test module, the semiconductor component will be placed and pressed by the pick-up head onto a test socket, allowing a sufficient contact between the tester and the semiconductor component to perform the parametric test. The tester will then segregate the semiconductor components based on the results. Any semiconductor components that failed either the visual inspection or the parametric tests, or both, will be rejected into a bin at one of the output module. On the other hand, the non defective semiconductor components that passed both the visual inspection and the parametric tests will be sent to another output modules, wherein a tube, a tape or a bin, or a combination thereof, is provided.

The description and sequence for the second input feeder (202b) is as described for the first input feeder (202a) above and is not repeated here. Although the drawings only show two input feeders (202a and 202b), it should be noted that more than two input feeders could be provided. As an example, with three input feeders, up to three different semiconductor components could be tested simultaneously by loading a different type of semiconductor component into each of the three input feeders. Of course, the user can choose to load all three input feeders with the same semiconductor components or load two of the input feeders with the same semiconductor components.

In one embodiment, the pick-up heads coupled to the periphery of the rotatable turret of the testing apparatus can be designed to move up and down concurrently to pneumatically pick up, press on and/or place the semiconductor components on the respective modules before advancing to the next module position for the next operation. In another embodiment, the pick-up heads move up and down independent of one another.

In a preferred embodiment, the plurality of module positions may include dummies without any functional module because in some situations the number of parametric tests required on the semiconductor components could be lower. Also, the module positions for the input feeders are preferably arranged in a circle.

Thus, since the invention disclosed herein may be embodied in other specific embodiments without departing from the scope or general characteristics thereof, the embodiments described herein are to be considered in all respects illustrative and not restrictive. The scope of the invention is to be indicated by the appended claims and all changes which come within the meaning and range of equivalence of the claims are intended to be embraced therein.

The invention claimed is:

1. A semiconductor components delivery system associated with a turret type testing apparatus for testing integrity and functionality of semiconductor components comprising:
    at least two input feeders loadable with semiconductor components to be vision checked, tested and/or packed;
    a plurality of spaced apart, sequentially arranged module positions for each input feeder, with selected module positions provided with modules, the modules seated on a locator mounted on a base plate of the testing apparatus, the modules include:
        a receiving module to receive semiconductor components fed sequentially from the input feeder;
        a rotary or gimbal module capable of adjusting the orientation of the semiconductor component placed on this module;
        at least one test module to perform integrity and/or functionality test and/or parametric test on the semiconductor component placed by the pick-up head on this module;
        at least one output module for non defective semiconductor components and
        at least one output module for rejected components; and
    a plurality of pick-up heads coupled to a periphery of a rotatable turret of the testing apparatus, with a pick-up head aligned vertically above each module position, and with each pick-up head advancing to the next module position concurrently with all other pick-up heads as the turret advances one module position at a time and with each pick-up head moveable vertically up and down to place, press on and/or pick up a semiconductor component from the respective module, beginning the sequence by picking up a semiconductor component at the receiving module.

2. The semiconductor components delivery system associated with a turret type testing apparatus for testing integrity and functionality of semiconductor components as in claim 1, wherein the input feeder is a bowl feeder, a tube loader, a tray loader or a detaper module.

3. The semiconductor components delivery system associated with a turret type testing apparatus for testing integrity and functionality of semiconductor components as in claim 1, wherein the type of semiconductor components loaded onto the input feeders are the same.

4. The semiconductor components delivery system associated with a turret type testing apparatus for testing integrity and functionality of semiconductor components as in claim 1, wherein the type of semiconductor components loaded onto different input feeders are different.

5. The semiconductor components delivery system associated with a turret type testing apparatus for testing integrity and functionality of semiconductor components as in claim 1, wherein for marked semiconductor components, the delivery system further includes a rotary table mounted with at least two semiconductor component holding modules located level with the module positions, with one of the component holding modules rotating into a module position located between the receiving module and the gimbal module as the rotary table turns.

6. The semiconductor components delivery system associated with a turret type testing apparatus for testing integrity and functionality of semiconductor components as in claim 5, wherein the rotary table rotates the component holding module to a position under a camera for visual inspection for any physical marking defects in the semiconductor component placed thereon by a pick-up head and after visual inspection the component holding module is rotated back into the same module position, enabling the semiconductor component to be picked up by a pick-up head for subsequent operation.

7. The semiconductor components delivery system associated with a turret type testing apparatus for testing integrity and functionality of semiconductor components as in claim 5, wherein the visual inspection further include checking on the polarity or orientation of the semiconductor components and providing a signal to the gimbal module to orientate the semiconductor component to the correct orientation if the orientation of the semiconductor component is checked otherwise.

8. The semiconductor components delivery system associated with a turret type testing apparatus for testing integrity and functionality of semiconductor components as in claim 1, wherein the output module for non defective semiconductor components is provided with a tube, a tape or a bin adapted to collect non defective semiconductor components that passed both the visual inspection and the parametric tests.

9. The semiconductor components delivery system associated with a turret type testing apparatus for testing integrity and functionality of semiconductor components as in claim 1, wherein each of the output modules for non defective semiconductor components is provided with either a tube, a tape or a bin, or a combination thereof, adapted to collect non defective semiconductor components that passed both the visual inspection and the parametric tests at the respective output module where the tube, the tape and/or the bin are provided.

10. The semiconductor components delivery system associated with a turret type testing apparatus for testing integrity and functionality of semiconductor components as in claim 1, wherein the pick-up heads move up and down concurrently to pneumatically pick up, press on and/or place the semiconductor components on the respective modules before advancing to the next module position for the next operation.

11. The semiconductor components delivery system associated with a turret type testing apparatus for testing integrity and functionality of semiconductor components as in claim 1, wherein the pick-up heads move up and down independent of one another.

12. The semiconductor components delivery system associated with a turret type testing apparatus for testing integrity and functionality of semiconductor components as in claim 1, wherein the plurality of module positions include dummy positions without any functional module.

13. The semiconductor components delivery system associated with a turret type testing apparatus for testing integrity and functionality of semiconductor components as in claim 1, wherein the module positions of input feeders are arranged in a circle.

* * * * *